(12) United States Patent
Kimura et al.

(10) Patent No.: US 11,888,446 B2
(45) Date of Patent: Jan. 30, 2024

(54) SEMICONDUCTOR DEVICE

(71) Applicant: SEMICONDUCTOR ENERGY LABORATORY CO., LTD., Atsugi (JP)

(72) Inventors: Kiyotaka Kimura, Kanagawa (JP); Takeya Hirose, Kanagawa (JP); Hidetomo Kobayashi, Kanagawa (JP); Takayuki Ikeda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 255 days.

(21) Appl. No.: 17/607,943

(22) PCT Filed: Apr. 27, 2020

(86) PCT No.: PCT/IB2020/053904
§ 371 (c)(1),
(2) Date: Nov. 1, 2021

(87) PCT Pub. No.: WO2020/225640
PCT Pub. Date: Nov. 12, 2020

(65) Prior Publication Data
US 2022/0286090 A1 Sep. 8, 2022

(30) Foreign Application Priority Data
May 8, 2019 (JP) .................. 2019-087999

(51) Int. Cl.
*H03D 7/14* (2006.01)
*H03D 7/12* (2006.01)
(Continued)

(52) U.S. Cl.
CPC .......... *H03D 7/12* (2013.01); *H01L 27/1207* (2013.01); *H01L 27/1225* (2013.01);
(Continued)

(58) Field of Classification Search
CPC ............ H03D 7/12; H03D 7/125; H03D 7/14; H03D 7/1425; H03D 7/1441;
(Continued)

(56) References Cited

U.S. PATENT DOCUMENTS 11,699,068 B2 * 7/2023 Ikeda ................... H04N 23/57
348/301
2012/0275279 A1 * 11/2012 Wilson .................. G11B 5/02
360/59

(Continued)

FOREIGN PATENT DOCUMENTS

CN 109478557 A 3/2019
JP 2003-051860 A 2/2003
(Continued)

OTHER PUBLICATIONS

International Search Report (Application No. PCT/IB2020/053904) dated Aug. 11, 2020.
(Continued)

*Primary Examiner* — Long Nguyen
(74) *Attorney, Agent, or Firm* — Fish & Richardson P.C.

(57) ABSTRACT

A semiconductor device with a novel structure is provided. The semiconductor device includes a mixer circuit including a digital-analog converter circuit, a control circuit for controlling the digital-analog converter circuit, a power source control switch, and a plurality of Gilbert circuits. The plurality of Gilbert circuits each include an analog potential holding circuit for holding an analog potential output from the digital-analog converter circuit. The control circuit has a function of outputting a signal for controlling the analog potential holding circuit and the digital-analog converter circuit. The power source control switch has a function of stopping supply of a power source voltage to the control circuit in a period during which the analog potential held in the analog potential holding circuit is not updated. The (Continued)

analog potential holding circuit includes a first transistor. The first transistor includes a semiconductor layer including an oxide semiconductor in a channel formation region.

9 Claims, 14 Drawing Sheets

(51) Int. Cl.
    *H01L 27/12*     (2006.01)
    *H01L 29/786*     (2006.01)
    *H10B 12/00*     (2023.01)

(52) U.S. Cl.
    CPC ...... *H01L 27/1255* (2013.01); *H01L 29/7869* (2013.01); *H01L 29/78648* (2013.01); *H10B 12/00* (2023.02)

(58) Field of Classification Search
    CPC ...... H03D 7/1483; H03D 7/1491; H04R 3/00; H04R 3/04; H04R 3/12; H01L 27/1225
    See application file for complete search history.

(56) References Cited

U.S. PATENT DOCUMENTS

| | | |
|---|---|---|
| 2018/0039882 A1 | 2/2018 | Ikeda. et al. |
| 2020/0226457 A1 | 7/2020 | Ikeda et al. |
| 2020/0388319 A1 | 12/2020 | Ishizu et al. |
| 2021/0318856 A1 | 10/2021 | Ikeda et al. |

FOREIGN PATENT DOCUMENTS

| | | |
|---|---|---|
| JP | 2010-028511 A | 2/2010 |
| JP | 2018-026812 A | 2/2018 |
| KR | 2019-0032387 A | 3/2019 |
| WO | WO-2009/030938 | 3/2009 |
| WO | WO-2018/025116 | 2/2018 |

OTHER PUBLICATIONS

Written Opinion (Application No. PCT/IB2020/053904) dated Aug. 11, 2020.

\* cited by examiner (ST71) Element substrate completed
(ST72) Dicing
(ST73) Die bonding
(ST74) Wire bonding
(ST75) Molding
(ST76) Lead plating and processing
(ST77) Marking
(ST78) Test
(ST79) Completed

SEMICONDUCTOR DEVICE

CROSS REFERENCE TO RELATED APPLICATIONS

This application is a U.S. National Phase Application under 35 U.S.C. § 371 of International Application PCT/IB2020/053904, filed on Apr. 27, 2020, which is incorporated by reference and claims the benefit of a foreign priority application filed in Japan on May 8, 2019, as Application No. 2019-087999.

TECHNICAL FIELD

One embodiment of the present invention relates to a semiconductor device.

In this specification and the like, a semiconductor device generally means a device that can function by utilizing semiconductor characteristics. It can be sometimes said that a display device (a liquid crystal display device, a light-emitting display device, and the like), a projection device, a lighting device, an electro-optical device, a power storage device, a memory device, a semiconductor circuit, an imaging device, a sensor device, and the like include a semiconductor device.

BACKGROUND ART

An audio codec is used for encoding analog audio data into digital data and decoding digital audio data into analog data in various applications. A mixer circuit in the audio codec has a function of amplifying and adding audio signals input from a plurality of channels and includes a circuit for controlling its gain (amplification factor).

A multiplier (also referred to as a multiplier circuit) for multiplying a first signal and a second signal is utilized in a mixer circuit for mixing signals. For example, Patent Document 1 discloses a Gilbert circuit (also referred to as a Gilbert cell) for performing mixing.

REFERENCE

Patent Document

[Patent Document 1] PCT International Publication No. 2009/030938

SUMMARY OF THE INVENTION

Problems to be Solved by the Invention

A mixer circuit of an audio codec needs to include a gain control circuit for each channel. The gain control circuit includes an analog-digital converter circuit for converting an effector signal into an analog voltage and a control circuit thereof. When the analog-digital converter circuit and the control circuit thereof have large circuit area and high power consumption, the circuit area and power consumption of the gain control circuit might increase with a larger number of channels.

An object of one embodiment of the present invention is to provide a semiconductor device with a novel structure that can inhibit an increase in circuit area. Another object of one embodiment of the present invention is to provide a semiconductor device with a novel structure that can inhibit an increase in power consumption. Another object of one embodiment of the present invention is to provide a novel semiconductor device and the like.

Note that the description of these objects does not preclude the existence of other objects. One embodiment of the present invention does not have to achieve all these objects. Other objects will be apparent from the description of the specification, the drawings, the claims, and the like and objects other than these can be derived from the description of the specification, the drawings, the claims, and the like.

Means for Solving the Problems

One embodiment of the present invention is a semiconductor device including a mixer circuit including a digital-analog converter circuit, a control circuit for controlling the digital-analog converter circuit, a power source control switch, and a plurality of Gilbert circuits; the plurality of Gilbert circuits each include an analog potential holding circuit for holding an analog potential output from the digital-analog converter circuit; the control circuit has a function of outputting a signal for controlling the analog potential holding circuit and the digital-analog converter circuit; the power source control switch has a function of stopping supply of a power source voltage to the control circuit in a period during which the analog potential held in the analog potential holding circuit is not updated; the analog potential holding circuit includes a first transistor; and the first transistor includes a semiconductor layer including an oxide semiconductor in a channel formation region.

In the semiconductor device of one embodiment of the present invention, preferably, the Gilbert circuits each include a second transistor and the second transistor includes a semiconductor layer including silicon in a channel formation region.

In the semiconductor device of one embodiment of the present invention, preferably, the first transistor is provided to overlap with a layer in which the second transistor is provided.

In the semiconductor device of one embodiment of the present invention, preferably, an adder circuit and an amplifier circuit are included; the adder circuit has a function of adding signals output from the plurality of Gilbert circuits; and the amplifier circuit has a function of amplifying and outputting signals output from the adder circuit.

Effect of the Invention

According to one embodiment of the present invention, a semiconductor device with a novel structure that can inhibit an increase in circuit area can be provided. A semiconductor device with a novel structure that can inhibit an increase in power consumption can also be provided. According to another embodiment of the present invention, a novel semiconductor device and the like can be provided.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

MODE FOR CARRYING OUT THE INVENTION

Figure 1:
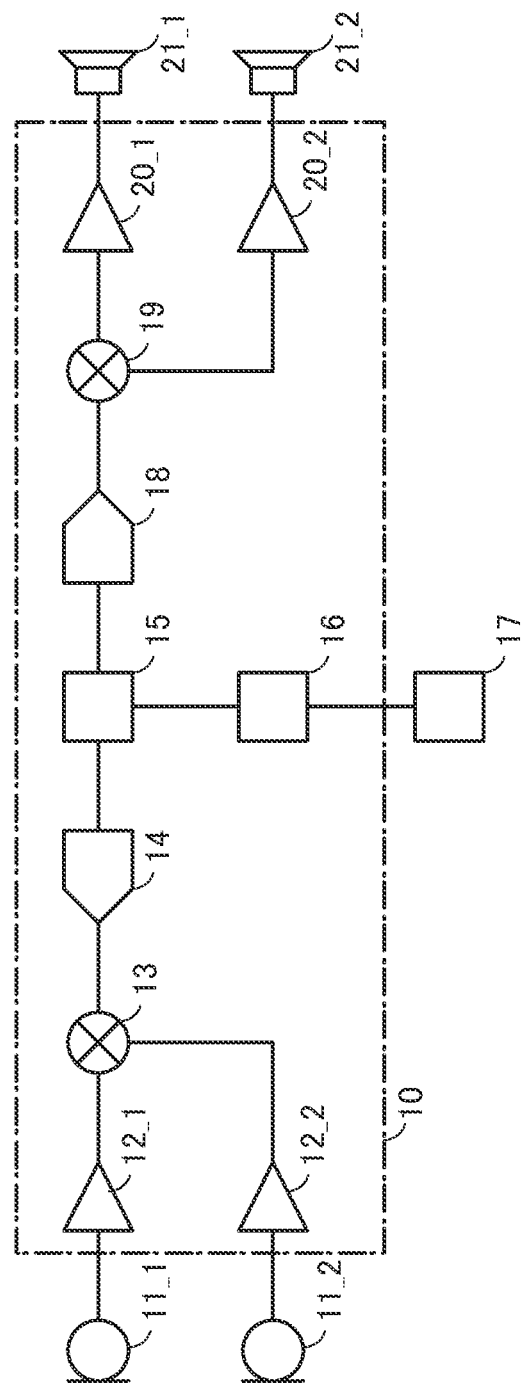
FIG. 1 is a block diagram illustrating a structure of a semiconductor device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power source potential VDD may be abbreviated to as a potential VDD, VDD, or the like, for example. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, the second wiring GL is referred to as a wiring GL[2].

Embodiment 1

A structure and operation of a semiconductor device of one embodiment of the present invention will be described with reference to FIG. 1 to FIG. 7. The semiconductor device of one embodiment of the present invention has a function of an audio codec that is used for encoding analog audio data into digital data and decoding digital audio data into analog data. In particular, the semiconductor device of one embodiment of the present invention has a function of a mixer circuit that amplifies and adds audio signals input from a plurality of channels and controls its gain (amplification factor) in a functional block serving as an audio codec.

FIG. 1 is a block diagram illustrating the semiconductor device of one embodiment of the present invention. FIG. 1 shows microphones 11_1 and 11_2, amplifier circuits 12_1 and 12_2, a mixer circuit 13, an analog-digital converter circuit 14, a digital effector 15, a digital interface 16, an external control circuit 17, a digital-analog converter circuit 18, a mixer circuit 19, amplifier circuits 20_1 and 20_2, and speakers 21_1 and 21_2, as an example.

In FIG. 1, the amplifier circuits 12_1 and 12_2, the mixer circuit 13, the analog-digital converter circuit 14, the digital effector 15, the digital interface 16, the digital-analog converter circuit 18, the mixer circuit 19, and the amplifier circuits 20_1 and 20_2 are shown as an audio codec 10. The audio codec 10 includes the mixer circuit 19 serving as a semiconductor device.

Although the two microphones 11_1 and 11_2 are shown in FIG. 1 as an example, three or more microphones may be provided. The number of the amplifier circuits 12_1 and 12_2 can be determined in accordance with the number of the microphones 11_1 and 11_2.

The mixer circuit 13 is a circuit for synthesizing analog audio data output from the microphones 11_1 and 11_2 through the amplifier circuits 121 and 12_2. The analog-digital converter circuit 14 is a circuit for converting the synthesized analog audio data into digital audio data.

The digital effector 15 is a circuit for processing the digital audio data output from the analog-digital converter circuit 14 in accordance with the control set by the external control circuit 17 through the digital interface 16.

The digital-analog converter circuit 18 is a circuit for processing the digital audio data, which has been processed by the digital effector 15, into analog audio data. In the case where a plurality of pieces of digital audio data are output from the digital effector 15, a plurality of digital-analog converter circuits 18 are provided.

The mixer circuit 19 is a circuit for synthesizing the analog audio data output from the digital effector 15 through the digital-analog converter circuit 18. The mixer circuit 19 has a function of multiplying a plurality of pieces of analog audio data and data controlled from the outside, and adding the multiplied signals to synthesize the analog audio data. The mixer circuit 19 outputs the synthesized analog audio data in accordance with the number of the speakers 21_1 and 21_2 provided in the subsequent stage. In the structure shown in FIG. 1, the mixer circuit 19 outputs two signals as an example, but may output three or more signals. The number of the amplifier circuits 20_1 and 20_2 can be equal to the number of the speakers 21_1 and 21_2.

Figure 2:
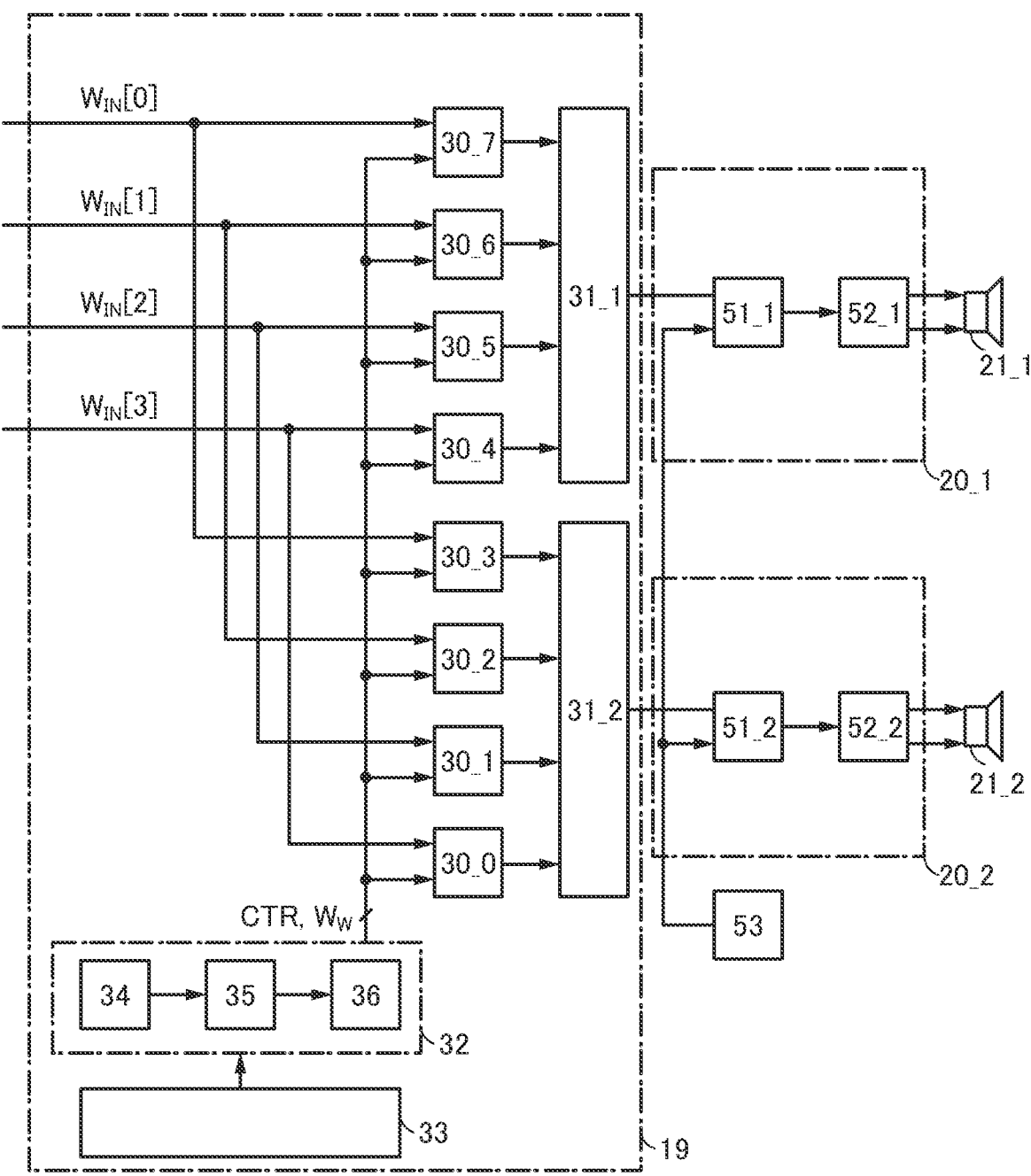
FIG. 2 is a block diagram illustrating a structure of a semiconductor device.

Next, FIG. 2 shows a block diagram of the mixer circuit 19 shown in FIG. 1, which serves as a semiconductor device.

Note that FIG. 2 also shows block diagrams of the amplifier circuits 20_1 and 20_2 and the speakers 21_1 and 21_2 for explanation.

FIG. 2 shows a configuration example of the mixer circuit 19, which includes a multiplier circuit 30 (multiplier circuits 30_0 to 30_7 are shown as an example), an adder circuit 31 (adder circuits 31_1 and 31_2 are shown as an example), a signal generation unit 32, and a power source control switch 33. The signal generation unit 32 includes an interface 34, a control circuit 35, and a digital-analog converter circuit 36.

The amplifier circuit 20_1 includes a comparison circuit 51_1 and a speaker driver circuit 521, and the amplifier circuit 20_2 includes a comparison circuit 51_2 and a speaker driver circuit 522. Signals output from the mixer circuit 19 and triangle waves output from a triangle wave generation circuit 53 are input to the comparison circuit 51_1 and the comparison circuit 51_2. The speaker driver circuit 52_1 and the speaker driver circuit 52_2 have a function of outputting signals for controlling the speakers 21_1 and 21_2 in accordance with the comparison results of the signals and the triangle waves output from the mixer circuit 19.

As the multiplier circuit 30, a plurality of multiplier circuits 30_0 to 30_7 are provided in accordance with the number of input signals. For example, when the analog audio data output from the digital effector 15 through the digital-analog converter circuit 18 illustrated in FIG. 1 is denoted as a signal $W_{IN}$, signals $W_{IN}[0]$ to $W_{IN}[3]$ are input as the signal $W_{IN}$ in FIG. 2.

In addition, a signal CTR and a signal $W_W$ are input from the signal generation unit 32 to the multiplier circuits 30_0 to 30_7. The signal CTR is a signal for controlling the on or off of a transistor in an analog potential holding circuit included in the multiplier circuits 30_0 to 30_7. The signal $W_W$ is a signal for supplying a potential that is to be held in the analog potential holding circuit included in the multiplier circuits 30_0 to 30_7.

The interface 34 included in the signal generation unit 32 serves as an interface for inputting a digital signal from the outside. For example, an I²C (Inter Integrated Circuit) interface can be used as the interface 34.

The control circuit 35 has a function of generating the signal CTR and a signal for controlling the digital-analog converter circuit 36 in accordance with a signal received by the interface 34.

The digital-analog converter circuit 36 is a circuit for generating the signal $W_W$, which is a signal for outputting an analog potential, in accordance with a digital signal output from the control circuit 35. The digital-analog converter circuit 36 has, for example, a circuit configuration in which digital-analog conversion is performed by charge and discharge of a capacitor for assigning weights based on a bit.

The power source control switch 33 is a circuit having a function of controlling supply of a power source voltage to each circuit included in the signal generation unit 32 in accordance with the control of the analog potential holding circuit included in the multiplier circuits 30_0 to 30_7. For example, the supply of the power source voltage to the interface 34 and the control circuit 35 is stopped with the signal $W_W$ being held in the aforementioned analog potential holding circuit, whereby the power consumption in the mixer circuit 19 can be reduced.

Figure 3A:
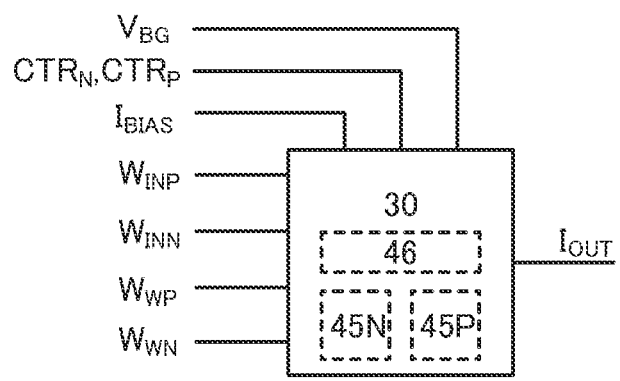
FIG. 3A and FIG. 3B are a block diagram and a circuit diagram each illustrating a structure of a semiconductor device.
Figure 3B:
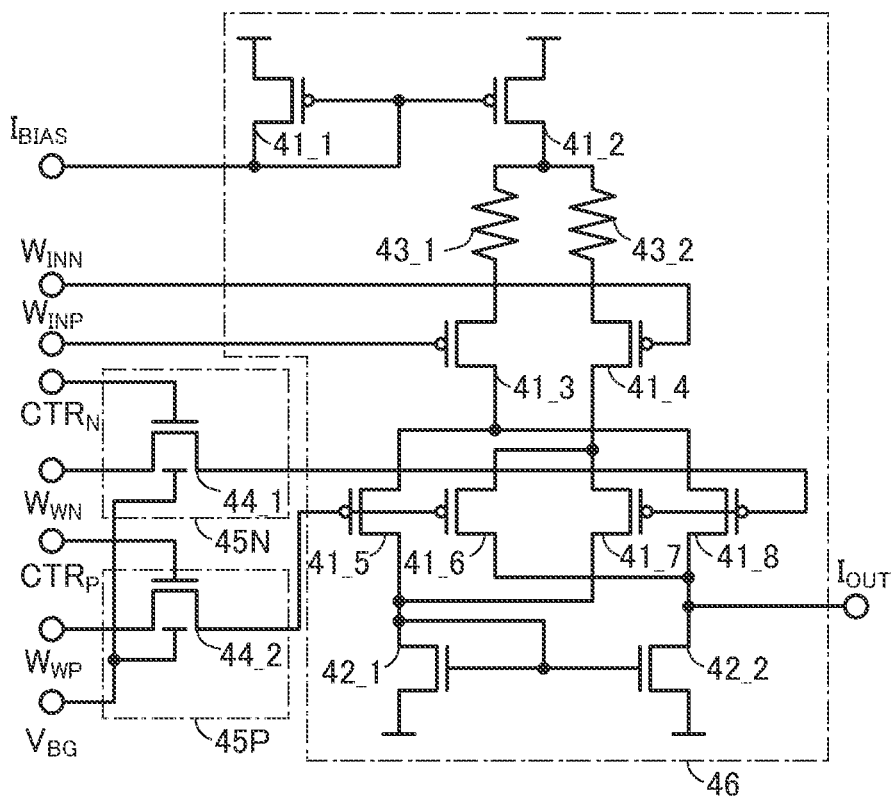

FIG. 3A and FIG. 3B are a block diagram and a circuit diagram illustrating a configuration example of the multiplier circuit 30 applicable to the multiplier circuits 30_0 to 30_7 shown in FIG. 2.

FIG. 3A shows a block diagram of a circuit serving as a multiplier circuit. The multiplier circuit 30 shown in FIG. 3A includes a circuit serving as a Gilbert circuit that operates with a differential signal, and analog potential holding circuits 45N and 45P that can hold an analog potential of the signal $W_W$ in accordance with the control of the signal CTR. Note that the Gilbert circuit is a circuit that can perform multiplication of two input signals.

A signal $W_{WP}$ and a signal $W_{WN}$ supplied to the block of the multiplier circuit 30 shown in FIG. 3A correspond to the signal $W_W$ and are supplied to transistors of a differential pair. A signal $W_{INP}$ and a signal $W_{INN}$ correspond to the signal $W_{IN}$ and are supplied to transistors of a differential pair. A signal $CTR_N$ and a signal $CTR_P$ correspond to signals of the signal CTR and have the same logic. A bias current $I_{BIAS}$ is a current supplied to a transistor for feeding a constant current. A back gate voltage $V_{BG}$ is a voltage supplied to back gates of transistors included in the analog potential holding circuits 45N and 45P. A signal $I_{OUT}$ is a current corresponding to the product of the signal $W_W$ and the signal $W_N$.

FIG. 3B is a circuit diagram applicable to the block diagram of the multiplier circuit 30 shown in FIG. 3A. The multiplier circuit 30 includes a Gilbert circuit 46, which includes a transistor 41_1, a transistor 41_2, a transistor 41_3, a transistor 41_4, a transistor 41_5, a transistor 41_6, a transistor 41_7, a transistor 418, a transistor 42_1, a transistor 42_2, a resistor 43_1, and a resistor 43_2, and the analog potential holding circuits 45N and 45P, which include a transistor 44_1 and a transistor 44_2 connected to gates of the transistors included in the Gilbert circuit. The signals and voltages illustrated in FIG. 3A are supplied to the gates of the transistors shown in FIG. 3B.

In FIG. 3B, the transistor 41_1, the transistor 41_2, the transistor 41_3, the transistor 41_4, the transistor 41_5, the transistor 41_6, the transistor 41_7, and the transistor 41_8 are transistors including silicon in channel formation regions (Si transistors), specifically p-channel Si transistors. The transistor 42_1 and the transistor 42_2 are n-channel Si transistors. Si transistors can be fabricated by a CMOS technology.

The transistor 44_1 and the transistor 442 are preferably formed with transistors including oxide semiconductors in channel formation regions (hereinafter referred to as OS transistors). In the structure of one embodiment of the present invention, the OS transistors are used as the transistors included in the analog potential holding circuits 45N and 45P; in that case, an extremely low leakage current flowing between a source and a drain in an off state (hereinafter referred to as an off-state current) can be utilized to hold the analog potential of the signal $W_W$ in the analog potential holding circuits 45N and 45P in accordance with the control of the signal CTR.

It is possible to reduce the frequency of updating the analog potential of the signal $W_W$ and achieve an intermittent operation of the signal generation unit 32, which outputs the signal $W_W$. The power source control switch 33 has a function of stopping supply of a power source voltage to the control circuit 35 in the signal generation unit 32 in a period during which the analog potential held in the analog potential holding circuit is not updated. The stop of the supply of the power source voltage to the signal generation unit 32 by the power source control switch 33 can achieve lower power consumption of the mixer circuit 19.

The analog potential holding circuits 45N and 45P using OS transistors can rewrite and read out analog voltages by charging and discharging electrical charges, thereby obtaining and reading out analog voltages a substantially unlimited number of times. Unlike a magnetic memory, a resistive random access memory, or the like, the analog potential holding circuits 45N and 45P using OS transistors have no change in the structure at the atomic level and thus exhibit high rewrite endurance. In addition, instability due to the increase of electron trap centers is not observed in the analog potential holding circuits 45N and 45P using OS transistors even when rewrite operation is repeated like in a flash memory.

The analog potential holding circuits 45N and 45P using OS transistors can be freely positioned over a circuit using a Si transistor, or the like, which allows even a plurality of analog potential holding circuits 45N and 45P to be easily integrated over the Gilbert circuit 46 formed with a Si transistor. Furthermore, an OS transistor can be fabricated with a manufacturing apparatus similar to that for a Si transistor and thus can be fabricated at low cost.

In addition, an OS transistor can be a four-terminal semiconductor element when having a back gate electrode in addition to a gate electrode, a source electrode, and a drain electrode. The OS transistor can be formed with an electric circuit network that can independently control input and output of signals flowing between a source and a drain depending on a voltage supplied to the gate electrode or the back gate electrode. Therefore, the circuit design can be made on the same concept as that for LSI. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

Figure 4A:
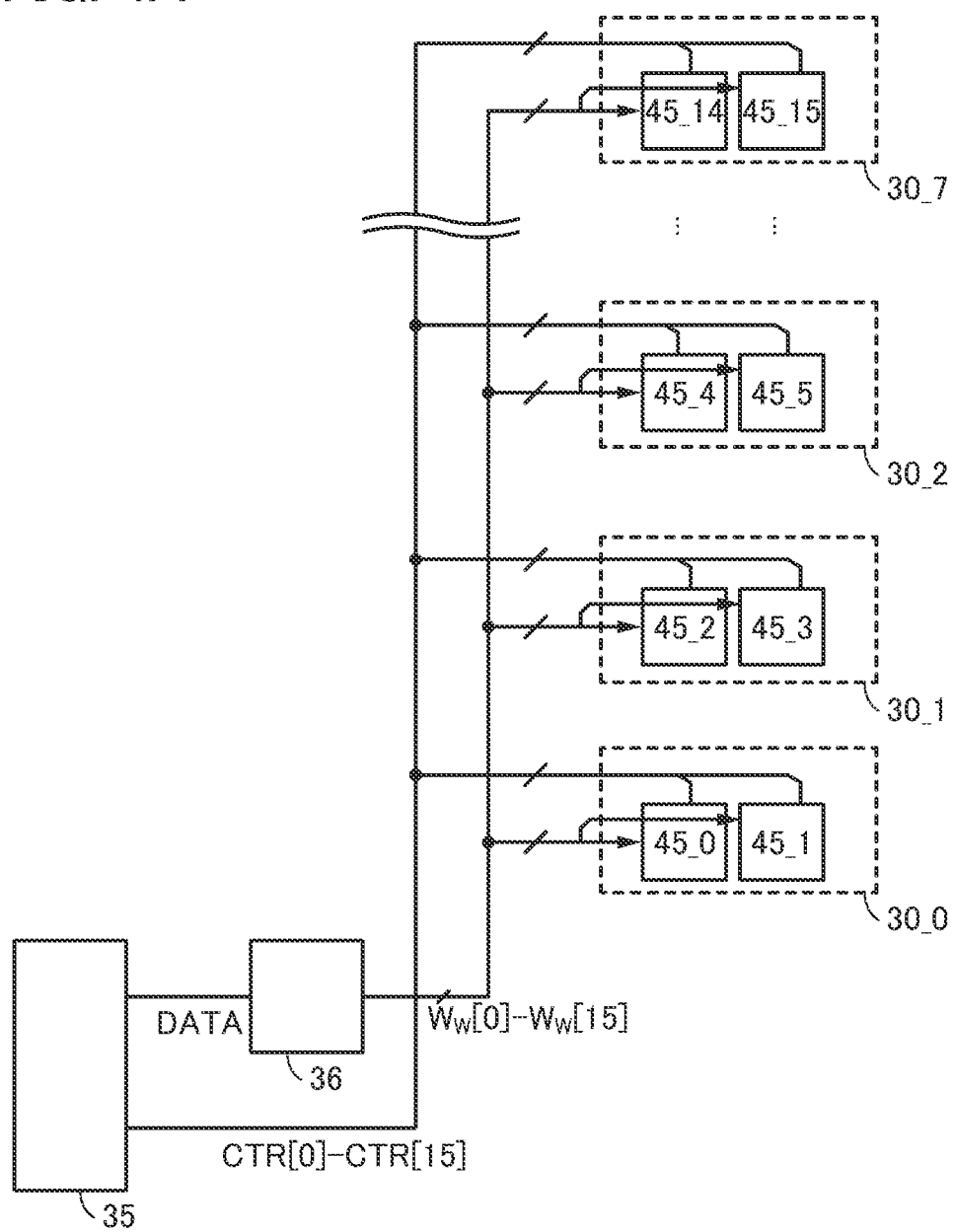
FIG. 4A and FIG. 4B are a block diagram and a circuit diagram each illustrating a structure of a semiconductor device.
Figure 4B:
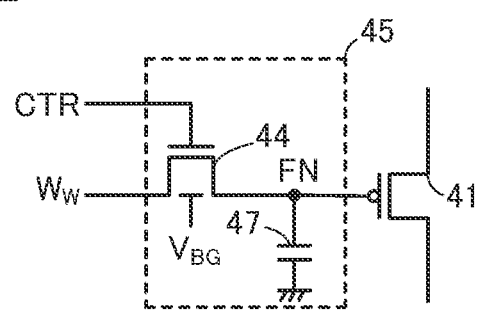

FIG. 4A and FIG. 4B show a block diagram and a circuit diagram illustrating operation of an analog potential holding circuit 45 applicable to the analog potential holding circuits 45N and 45P illustrated in FIG. 3A and FIG. 3B. Note that the analog potential holding circuits 45N and 45P are circuits for holding analog potentials supplied as differential signals, and have the same circuit configuration. Thus, the analog potential holding circuits 45N and 45P are sometimes referred to as the analog potential holding circuit 45 when the circuit configuration thereof is described.

FIG. 4A shows the multiplier circuits 30_0 to 30_7 as the multiplier circuit 30 and analog potential holding circuits 45_0 to 45_15 as the analog potential holding circuit 45 in addition to the control circuit 35 and the digital-analog converter circuit 36 illustrated in FIG. 2, FIG. 3A, and FIG. 3B. In the analog potential holding circuits 45_0 to 45_15, for example, the analog potential holding circuits 45_0 and 45_1 correspond to the analog potential holding circuits 45N and 45P illustrated in FIG. 3A and FIG. 3B. In FIG. 4A, a signal $W_W[0]$ to a signal $W_W[15]$ and signals CTR[0] to CTR[15] are shown as the signal $W_W$ and the signal CTR illustrated above in FIG. 2, FIG. 3A, and FIG. 3B, and a signal DATA is shown as digital data output from the control circuit 35 to the digital-analog converter circuit 36. A pair of signals in the signal $W_W[0]$ to the signal $W_W[15]$ correspond to the signal $W_{WP}$ and the signal $W_{WN}$ illustrated in FIG. 3A and FIG. 3B. A pair of signals in the signals CTR[0] to CTR[15] correspond to the signal $CTR_N$ and the signal $CTR_P$ illustrated in FIG. 3A and FIG. 3B.

As shown in FIG. 4A, the control circuit 35 outputs the signal DATA to the digital-analog converter circuit 36. The digital-analog converter circuit 36 outputs the signal $W_W[0]$ to the signal $W_W[15]$ with analog values respectively to the analog potential holding circuits 45_0 to 45_15 included in the multiplier circuits 30_0 to 30_7 in accordance with the signal DATA. Furthermore, the control circuit 35 outputs the signals CTR[0] to CTR[15] for controlling the on or off of transistors included in the analog potential holding circuits 45_0 to 45_15.

FIG. 4B shows a circuit configuration of the analog potential holding circuit 45 applicable to the analog potential holding circuits 45_0 to 45_15 in FIG. 4A. Note that in the description of FIG. 4B, the signal $W_W[0]$ to the signal $W_W[15]$ illustrated in FIG. 4A are referred to as the signal $W_W$, and the signals CTR[0] to CTR[15] are referred to as the signal CTR for explanation.

The analog potential holding circuit 45 includes a transistor 44, which is an OS transistor. The signal $W_W$ is supplied from one of a source and a drain of the transistor 44. A potential based on the signal $W_W$ is held in a node FN at which the other of the source and the drain of the transistor 44 is connected to a gate of a transistor 41. The transistor 41 corresponds to a Si transistor included in the Gilbert circuit 46. The node FN preferably includes a capacitor 47 for holding electrical charges. The signal CTR for controlling the on or off of the transistor 44 is supplied to a gate of the transistor 44. The back gate voltage $V_{BG}$ for controlling the threshold voltage of the transistor 44 is applied to a back gate of the transistor 44.

Figure 5:
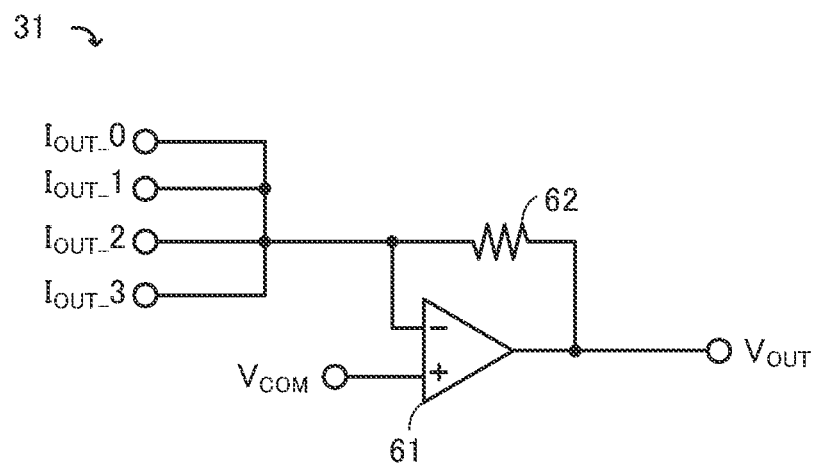
FIG. 5 is a circuit diagram illustrating a structure of a semiconductor device.

FIG. 5 is a circuit diagram illustrating a configuration example of the adder circuit 31 illustrated above in FIG. 2. FIG. 5 shows signals $I_{OUT\_0}$ to $I_{OUT\_3}$ as the signal $I_{OUT}$ input to the adder circuit 31, an operational amplifier 61, a resistor 62, and a signal $V_{OUT}$ output from the adder circuit 31. $V_{COM}$ is a reference potential. For example, the signal $V_{OUT}$ that has a voltage value based on the sum of currents can be obtained with the configuration of the adder circuit shown in FIG. 5.

Figure 6:
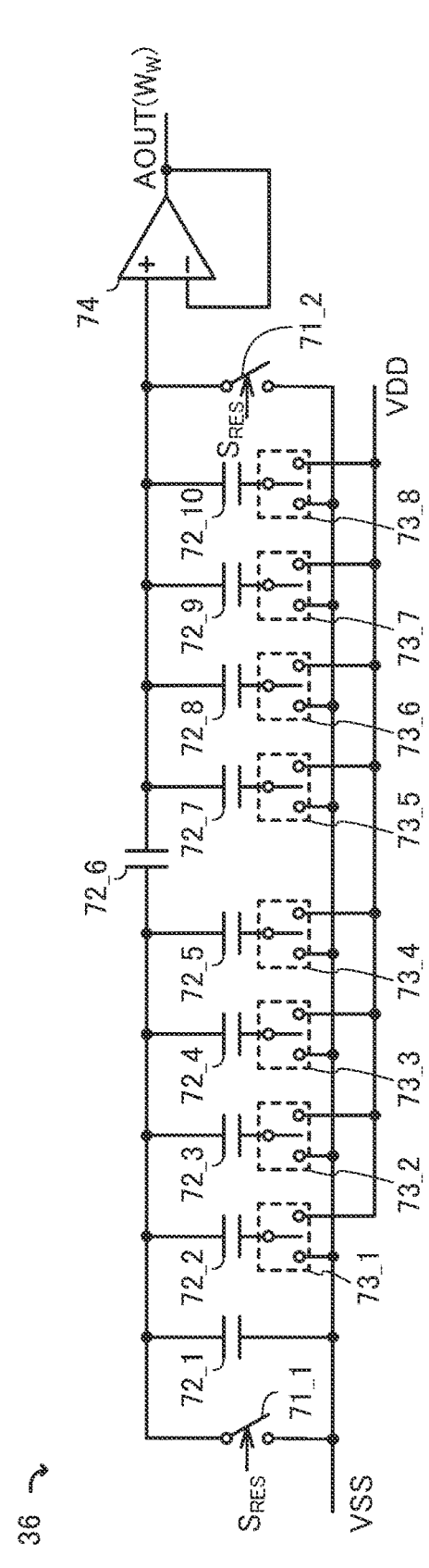
FIG. 6 is a circuit diagram illustrating a structure of a semiconductor device.

FIG. 6 is a circuit diagram illustrating a configuration example of the digital-analog converter circuit 36 illustrated above in FIG. 2. FIG. 6 shows switches 71_1 and 71_2, capacitors 72_1 to 72_10, selector switches 73_1 to 73_8, and an operational amplifier 74. FIG. 6 shows the digital-analog converter circuit 36 having an 8-bit resolution as an example. The capacitance ratio of the capacitors 72_1 to 72_10 is 1:1:2:4:8:(8/7):1:2:4:8. The signal DATA, which is an 8-bit digital signal, is a signal for controlling switching of the selector switches 73_1 to 73_8. A signal $S_{RES}$ controls the on or off of the switches 71_1 and 71_2. The selector switches 73_1 to 738 change a connection between a wiring supplying a potential VDD and a wiring supplying a potential VSS (<VDD). An example of the structure is such that the wiring supplying the potential VSS is connected when the signal DATA is at L level and the connection is switched to the wiring supplying the potential VDD when the signal DATA is at H level. The operational amplifier 74 can output a signal AOUT (=the signal $W_W$) with an analog value.

Figure 7:
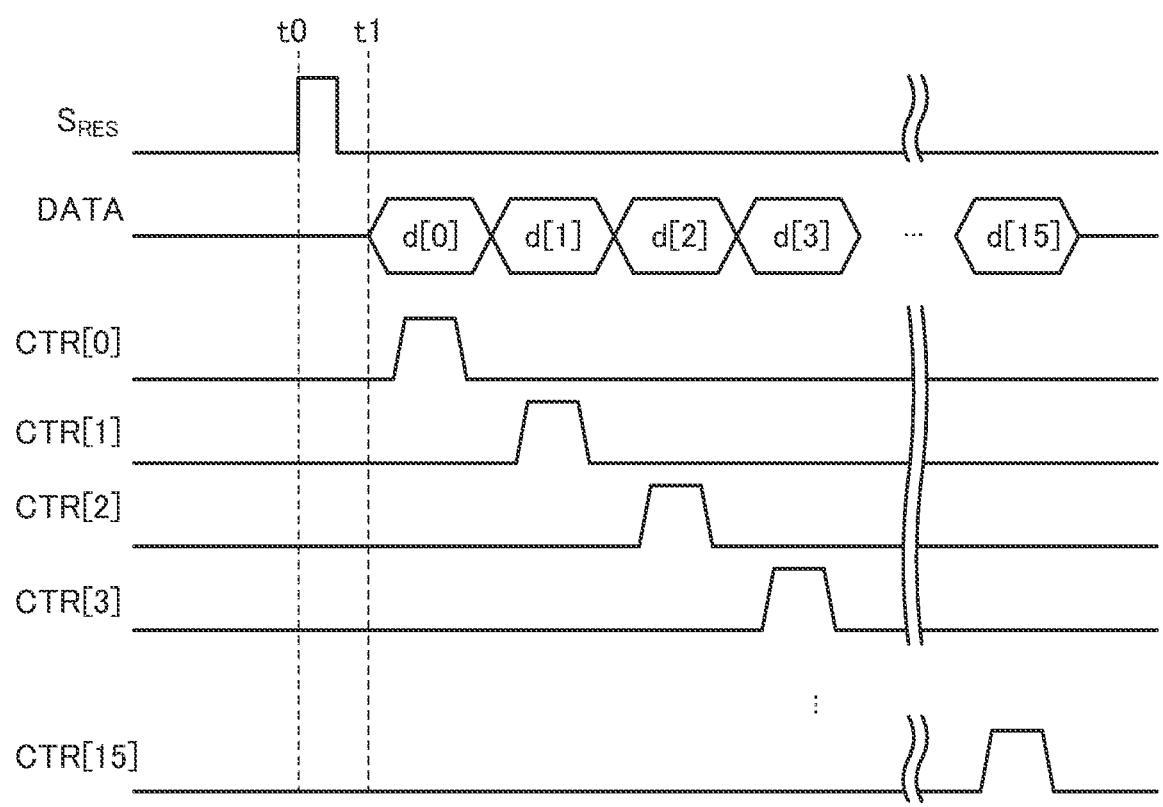
FIG. 7 is a timing chart illustrating a structure of a semiconductor device.

FIG. 7 shows a timing chart illustrating operation of each signal in the circuits illustrated in FIG. 5B and FIG. 6. In FIG. 7, signals d[0] to d[15] are shown as the signal DATA.

In the timing chart shown in FIG. 7, the digital-analog converter circuit 36 is initialized at Time t0. The initialization is performed by turning on the switches 71_1 and 71_2 with the signal $S_{RES}$ set to H level.

Then, at Time t1, the signal d[0] is supplied as the signal DATA to the digital-analog converter circuit 36. The digital-analog converter circuit 36 outputs the signal AOUT (=the signal $W_W$) with an analog value based on the signal d[0]. The signal AOUT can be written to the analog potential holding circuit 45_0 included in the multiplier circuit 30_0 when the signal CTR[0] is set to H level. When the signal CTR[0] is then set to L level, the analog potential holding circuit 45_0 can keep holding a potential based on the signal AOUT.

After that, the signals d[1] to d[15] are supplied as the signal DATA to the digital-analog converter circuit 36, whereby the signal AOUT with an analog value based on the signal DATA can be written to the analog potential holding circuit 45 sequentially. Thus, a multichannel gain can be controlled by a single digital-analog converter circuit 36.

In the aforementioned semiconductor device of one embodiment of the present invention, an increase in circuit area can be inhibited. An increase in power consumption can also be inhibited.

Embodiment 2

In this embodiment, a structure of a transistor applicable to the semiconductor device described in the above embodiment, specifically, a structure in which transistors having different electrical characteristics are stacked will be described. In particular, in this embodiment, a structure of each transistor included in a mixer circuit in the semiconductor device will be described. With the structure, the degree of flexibility in design of the semiconductor device can be increased. Furthermore, when transistors having different electrical characteristics are stacked, the integration degree of the semiconductor device can be increased.

Figure 8:
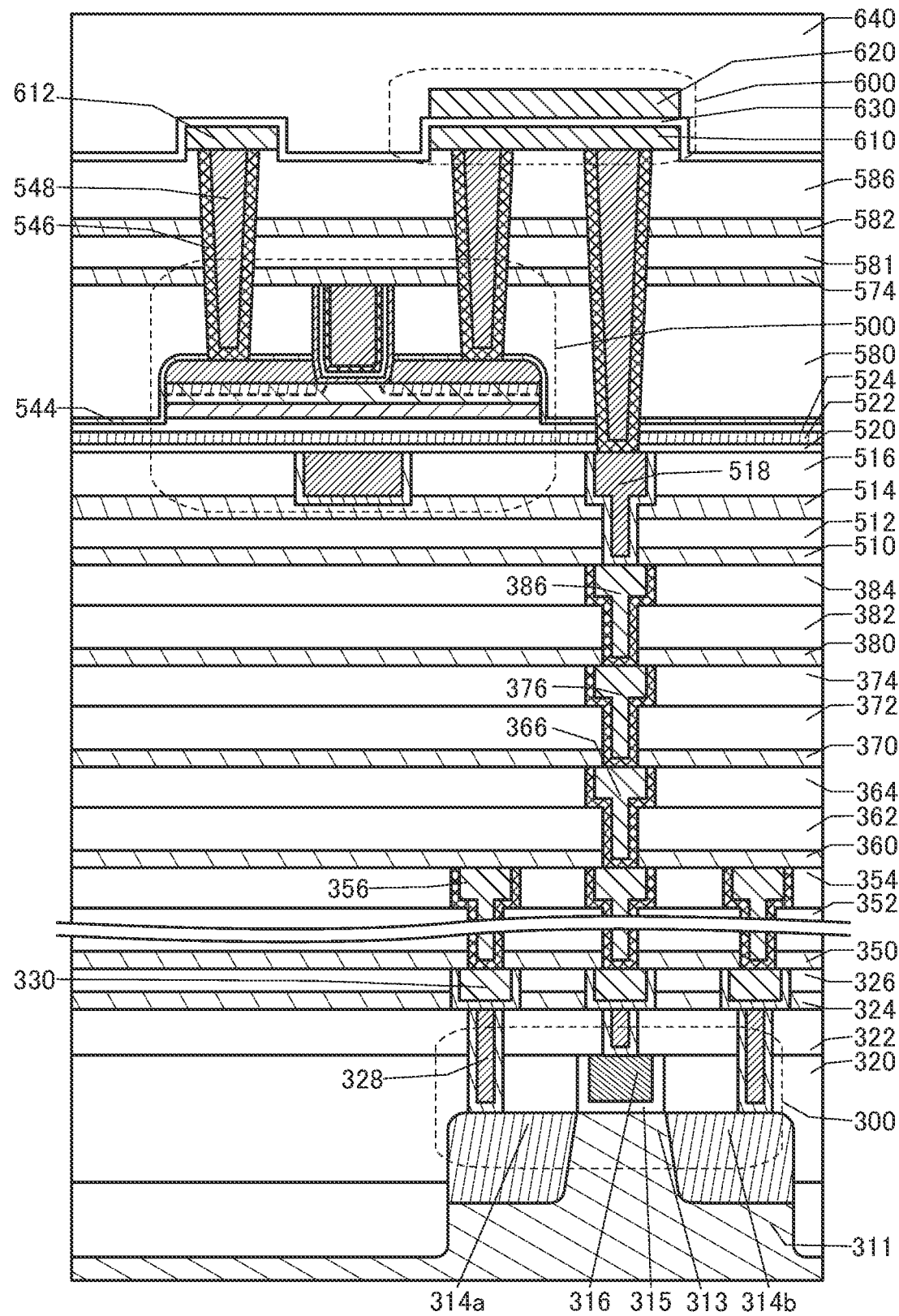
FIG. 8 is a cross-sectional view showing a structure example of a semiconductor device.
Figure 10A:
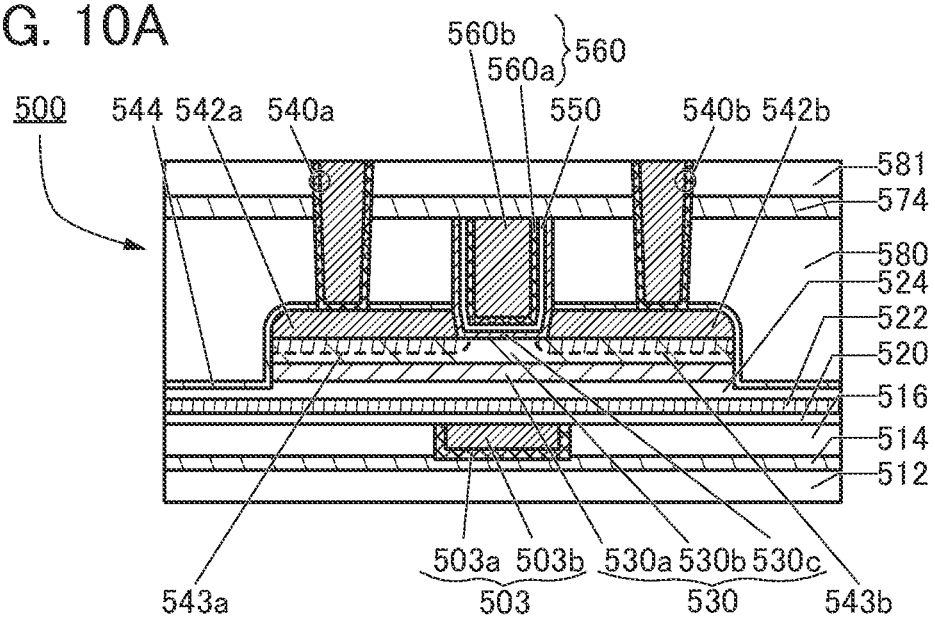
FIG. 10A to FIG. 10C are cross-sectional views showing structure examples of transistors.
Figure 10B:
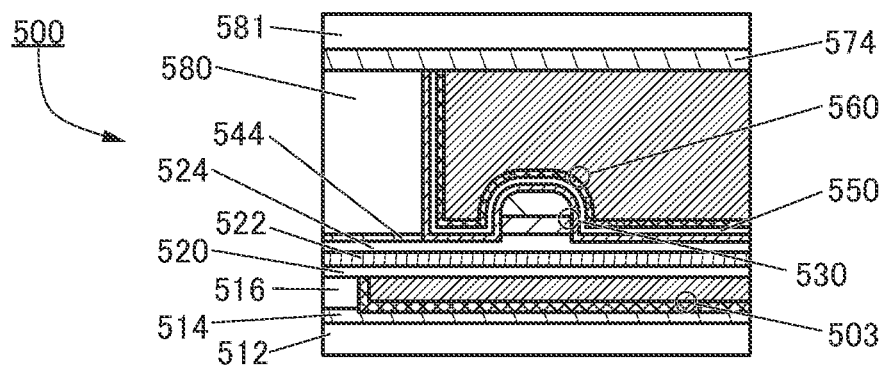
Figure 10C:
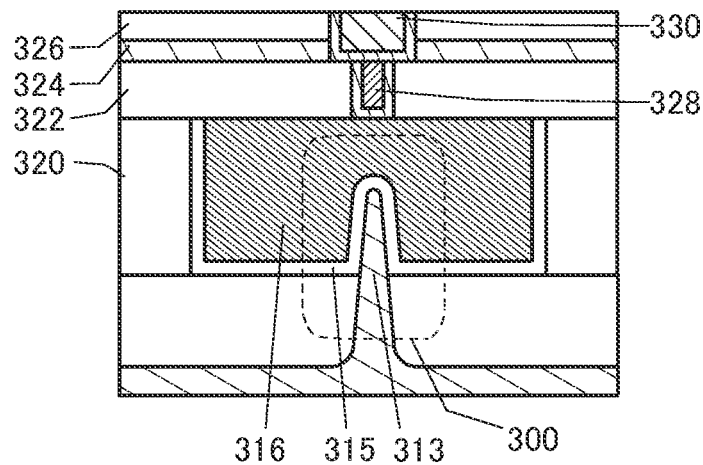

A semiconductor device shown in FIG. 8 includes a transistor 300, a transistor 500, and a capacitor 600. FIG. 10A is a cross-sectional view of the transistor 500 in the channel length direction, FIG. 10B is a cross-sectional view of the transistor 500 in the channel width direction, and FIG. 10C is a cross-sectional view of the transistor 300 in the channel width direction.

The transistor 500 is a transistor including a metal oxide in a channel formation region (an OS transistor). Since the off-state current of the transistor 500 is low, when the transistor 500 is used as an OS transistor included in the semiconductor device, written data voltage or charge can be retained for a long time. In other words, the frequency of refresh operation is low or refresh operation is not required; thus, the power consumption of the semiconductor device can be reduced.

The semiconductor device described in this embodiment includes the transistor 300, the transistor 500, and the capacitor 600, as shown in FIG. 8. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. For example, the transistor 300 can be used as the transistor or the like included in the Gilbert circuit 46 in the above embodiment.

In the transistor 300, the top surface and the side surface in the channel width direction of the semiconductor region 313 are covered with the conductor 316 with the insulator 315 therebetween, as shown in FIG. 10C. Such a Fin-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 9:
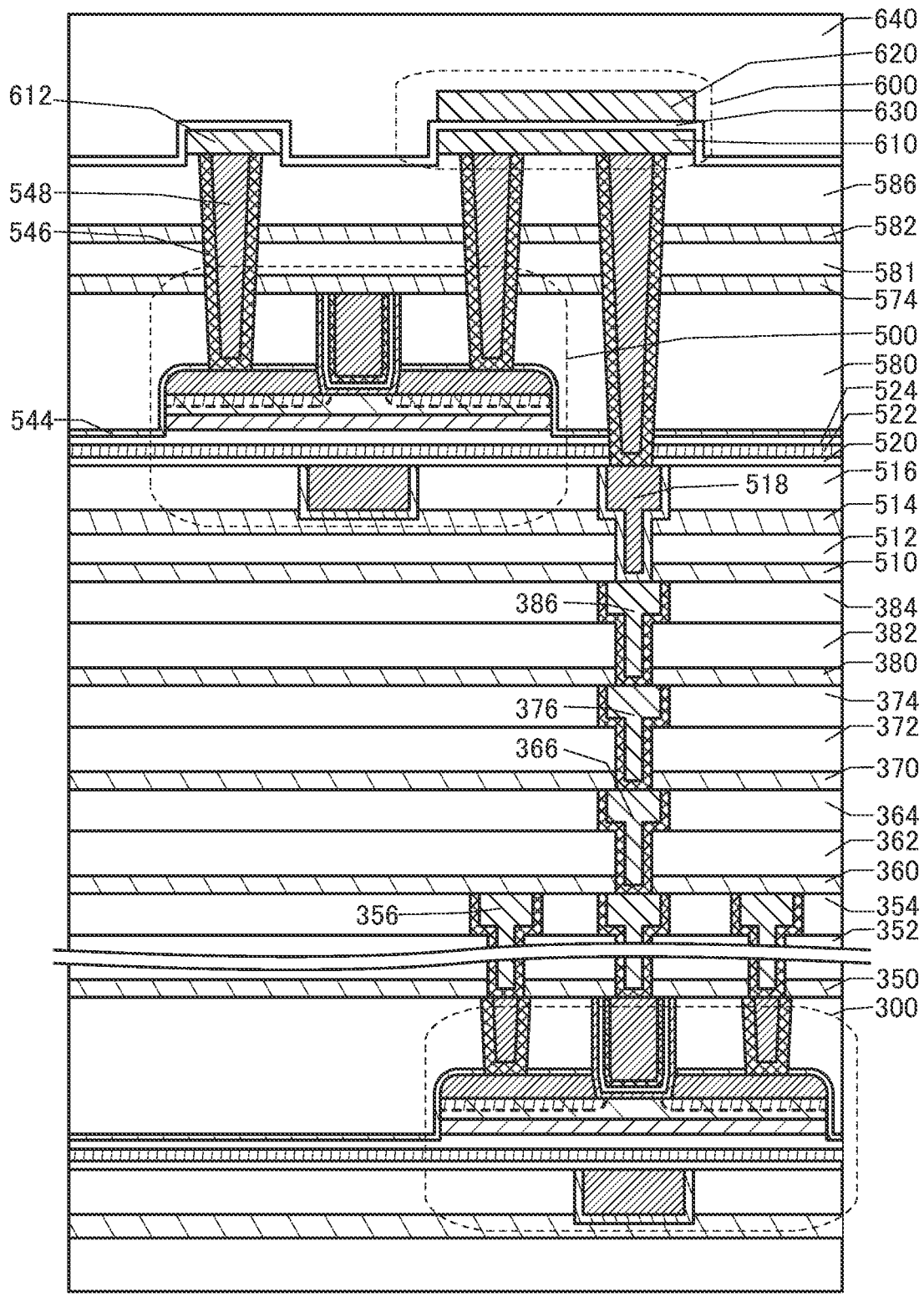
FIG. 9 is a cross-sectional view showing a structure example of a semiconductor device.

Note that the transistor 300 shown in FIG. 8 is an example and the structure is not limited thereto; an appropriate transistor can be used in accordance with a circuit structure or a driving method. For example, when the semiconductor device is a single-polarity circuit using only OS transistors (which means a circuit constituted by transistors having the same polarity, e.g., only n-channel transistors), the transistor 300 has a structure similar to that of the transistor 500 using an oxide semiconductor, as shown in FIG. 9. Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 300, or the like to a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material having a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 8, an insulator 350, an insulator 352, and an insulator 354 are stacked in this order. A conductor 356 is formed in the insulator 350, the insulator 352, and the insulator 354. The conductor 356 has a function of a plug or a wiring that is connected to the transistor 300. Note that the conductor 356 can be formed using a material similar to the materials for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With the structure, the transistor 300 and the transistor 500 can be separated by the barrier layer, so that the diffusion of hydrogen from the transistor 300 to the transistor 500 can be inhibited.

Note that for the conductor having a barrier property against hydrogen, tantalum nitride is preferably used, for example. Stacking tantalum nitride and tungsten having high conductivity can inhibit the diffusion of hydrogen from the transistor 300 while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 8, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to the materials for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With the structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 8, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to the materials for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With the structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 8, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to the materials for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With the structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like to the region where the transistor 500 is provided. Therefore, a material similar to the material for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to the material for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to the material for the conductor 328 and the conductor 330.

In particular, the conductor 518 in a region in contact with the insulator 510 and the insulator 514 is preferably a conductor having a barrier property against oxygen, hydrogen, and water. With the structure, the transistor 300 and the transistor 500 can be separated by the layer having a barrier property against oxygen, hydrogen, and water; thus, diffusion of hydrogen from the transistor 300 to the transistor 500 can be inhibited.

The transistor 500 is provided above the insulator 516.

As shown in FIG. 10A and FIG. 10B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As shown in FIG. 10A and FIG. 10B, an insulator 544 is preferably positioned between the insulator 580 and the oxide 530a, the oxide 530b, the conductor 542a, and the conductor 542b. In addition, as shown in FIG. 10A and FIG. 10B, the conductor 560 preferably includes a conductor 560a provided inside the insulator 550 and a conductor 560b embedded inside the conductor 560a. As shown in FIG. 10A and FIG. 10B, an insulator 574 is preferably positioned over the insulator 580, the conductor 560, the insulator 550, and the oxide 530c.

Note that in the following description, the oxide 530a, the oxide 530b, and the oxide 530c are sometimes collectively referred to as an oxide 530.

Note that although the transistor 500 has a structure in which three layers of the oxide 530a, the oxide 530b, and the oxide 530c are stacked in a region where a channel is formed and its vicinity, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Although the conductor 560 of the transistor 500 has a stacked-layer structure of two layers, the present invention is not limited thereto. For example, the conductor 560 may have a single-layer structure or a stacked-layer structure of three or more layers. The transistor 500 shown in FIG. 8 and FIG. 10A is an example and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 functions as a first gate (also referred to as a top gate) electrode in some cases. The conductor 503 functions as a second gate (also referred to as a bottom gate) electrode in some cases. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of an opening in the insulator 514 and the insulator 516, and a conductor 503b is formed on the inner side. Although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in the conductivity of the conductor 503b due to oxidation can be inhibited.

In the case where the conductor 503 also functions as a wiring, a conductive material with high conductivity that contains tungsten, copper, or aluminum as its main component is preferably used for the conductor 503b. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

In the case where the insulator 524 includes an excess-oxygen region, it is preferable that the insulator 522 have a function of inhibiting diffusion of oxygen (e.g., an oxygen atom or an oxygen molecule) (the oxygen is less likely to pass).

The insulator 522 preferably has a function of inhibiting diffusion of oxygen or impurities, in which case diffusion of oxygen contained in the oxide 530 to the insulator 520 side is prevented. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 to the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator which is a high-k material is combined with silicon oxide or silicon oxynitride, the insulator 520 having a stacked-layer structure that has thermal stability and a high relative permittivity can be obtained.

Note that in the transistor 500 in FIG. 10A and FIG. 10B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

The metal oxide functioning as the channel formation region in the oxide 530 preferably has a band gap of 2 eV or higher, further preferably 2.5 eV or higher. With the use of a metal oxide having such a wide band gap, the off-state current of the transistor can be reduced.

By including the oxide 530a under the oxide 530b, the oxide 530 can inhibit diffusion of impurities to the oxide 530b from the components formed below the oxide 530a. By including the oxide 530c over the oxide 530b, the oxide 530 can inhibit diffusion of impurities into the oxide 530b from the components formed above the oxide 530c.

The oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably greater than the atomic ratio of the element M to the constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a. Moreover, a metal oxide that can be used as the oxide 530a or the oxide 530b can be used as the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

Although the conductor 542a and the conductor 542b each have a single-layer structure in FIG. 10, they may each have a stacked-layer structure of two or more layers. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 10A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. The channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 to the oxide 530b through the oxide 530c and the insulator 550 can be inhibited.

The insulator 550 functions as a first gate insulating film. The insulator 550 is preferably positioned in contact with an inner side (the top surface and the side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, the concentration of impurities such as water and hydrogen in the insulator 550 is preferably reduced as in the insulator 524. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 functioning as the first gate electrode has a two-layer structure in FIG. 10A and FIG. 10B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor applicable to the oxide 530 can be used. In that case, when the conductor 560b is deposited by a sputtering method, the conductor 560a can have a reduced electrical resistance value to be a conductor. This can be called an OC (Oxide Conductor) electrode.

A conductive material containing tungsten, copper, or aluminum as its main component is preferably used for the conductor 560b. The conductor 560b also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water and hydrogen in the insulator 580 is preferably reduced.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in the conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with a top surface of the insulator 580, a top surface of the conductor 560, a top surface of the insulator 550, and a top surface of the oxide 530c. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. The concentration of impurities such as water and hydrogen in the insulator 581 is preferably reduced as in the insulator 524 or the like.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to the material for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in the electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to the material for the insulator 320 can be used. Furthermore, when a material with a comparatively low permittivity is used for these insulators, parasitic capacitance generated between wirings can be reduced. For example, a silicon oxide film, a silicon oxynitride film, or the like can be used for the insulator 586.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 shown in FIG. 8 each have a single-layer structure, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 640 is provided over the conductor 620 and the insulator 630. The insulator 640 can be provided using a material similar to the material for the insulator 320. In addition, the insulator 640 may function as a planarization film that covers an uneven shape therebelow.

With the use of this structure, a semiconductor device using a transistor including an oxide semiconductor can be miniaturized or highly integrated.

Embodiment 3

In this embodiment, an IC chip, an electronic component, electronic devices, and the like will be described as examples of a semiconductor device.

<Fabrication Method Example of Electronic Component>

Figure 11A:
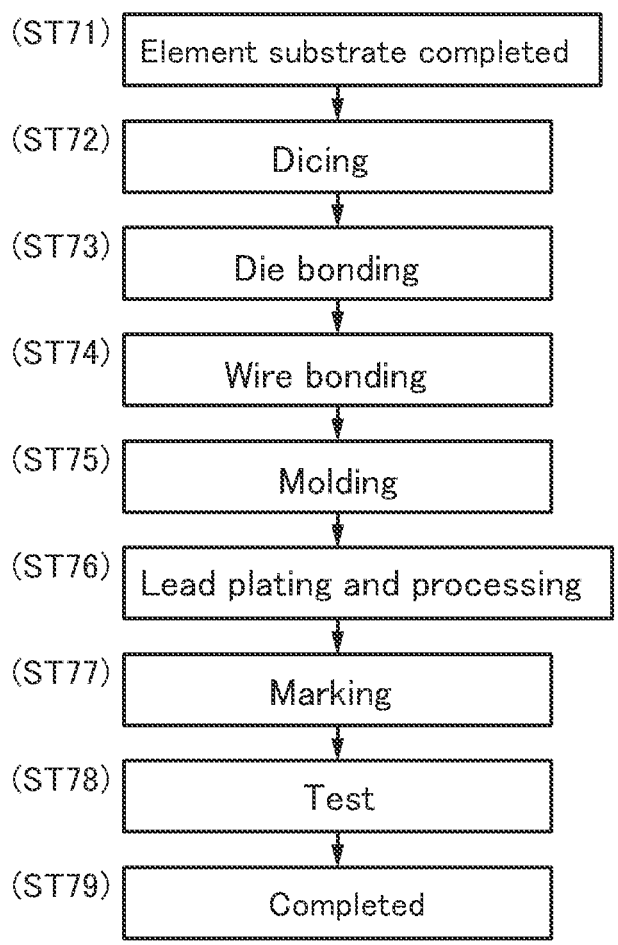
FIG. 11A to FIG. 11E are diagrams illustrating structures of a semiconductor wafer and an electronic component.

FIG. 11A is a flow chart showing an example of a method for fabricating an electronic component. The electronic component is also referred to as a semiconductor package or an IC package. For the electronic component, there are a plurality of standards and names corresponding to a terminal extraction direction and a terminal shape. Thus, an example thereof is described in this embodiment. The electronic component described below corresponds to an electronic component provided with transistors included in a Gilbert circuit of a semiconductor device.

A semiconductor device formed with transistors is completed by integrating detachable components on a printed circuit board through an assembly process (post-process). The post-process can be completed through steps shown in FIG. 11A. Specifically, after an element substrate obtained in a pre-process is completed (Step ST71), a back surface of the substrate is ground. The substrate is thinned in this step to reduce warpage or the like of the substrate in the pre-process and to reduce the size of the component. Then, a dicing step of dividing the substrate into a plurality of chips is performed (Step ST72).

Figure 11B:
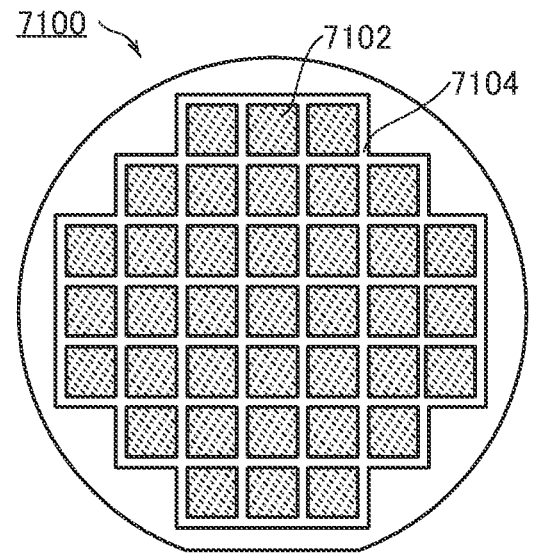
Figure 11C:
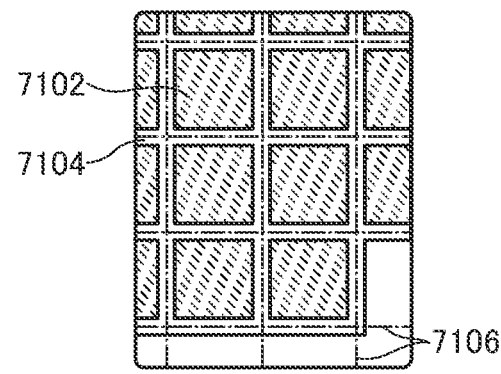

FIG. 11B is a top view of a semiconductor wafer 7100 before a dicing process. FIG. 11C is an enlarged view of part of FIG. 11B. A plurality of circuit regions 7102 are provided on the semiconductor wafer 7100. The semiconductor device of an embodiment of the present invention is provided in the circuit region 7102.

Figure 11D:
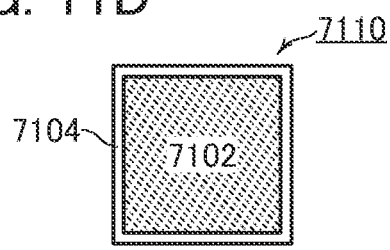

The plurality of circuit regions 7102 are each surrounded by a separation region 7104. Separation lines (also referred to as "dicing lines") 7106 are set at positions overlapping with the separation region 7104. In the dicing step ST72, the semiconductor wafer 7100 is cut along the separation lines 7106, whereby chips 7110 including the circuit regions 7102 are cut out from the semiconductor wafer 7100. FIG. 11D is an enlarged view of the chip 7110.

A conductive layer or a semiconductor layer may be provided in the separation region 7104. Providing a conductive layer or a semiconductor layer in the separation region 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation region 7104 allows a reduction in the usage of the pure water. Therefore, the manufacturing cost of semiconductor device can be reduced. Furthermore, the productivity of the semiconductor device can be increased.

After Step ST72, the divided chips are separately picked up, placed on a lead frame, and bonded thereto in a die bonding step (Step ST73). As a method for bonding the chip to the lead frame in the die bonding step, a method suitable for the product may be selected. The bonding may be performed, for example, with a resin or a tape. In the die bonding step, the chip may be mounted on an interposer and bonded thereto. In a wire bonding step, a lead of the lead frame and an electrode on the chip are electrically connected to each other with a metal fine line (wire) (Step ST74). A silver line or a gold line can be used as the metal fine line. The wire bonding may be either ball bonding or wedge bonding.

A wire-bonded chip is subjected to a molding step of sealing the chip with an epoxy resin or the like (Step ST75). With the molding step, the inside of the electronic component is filled with a resin, so that damage to the circuit portion and the wire embedded by external mechanical force can be reduced, and degradation in characteristics due to moisture or dust can be reduced. The lead of the lead frame is subjected to plating treatment. After that, the lead is cut and processed (Step ST76). This plating treatment prevents rust of the lead and enables more reliable soldering at the time of mounting the electronic component on a printed circuit board in a later step. Printing treatment (marking) is performed on a surface of the package (Step ST77). After a testing step (Step ST78), the electronic component is completed (Step ST79).

Figure 11E:
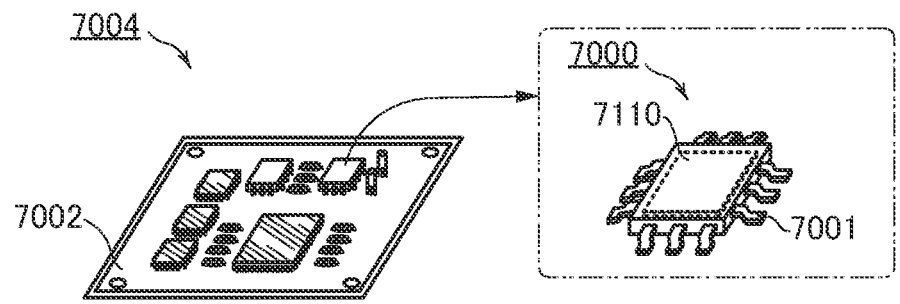

FIG. 11E shows a schematic perspective view of the completed electronic component. FIG. 11E shows a schematic perspective view of a QFP (Quad Flat Package) as an example of the electronic component. As shown in FIG. 11E, an electronic component 7000 includes a lead 7001 and a chip 7110.

The electronic component 7000 is mounted on a printed circuit board 7002, for example. A plurality of electronic components 7000 which are combined and electrically connected to each other over the printed circuit board 7002 can be mounted on an electronic device. A completed circuit board 7004 is provided in an electronic device or the like.

The electronic component 7000 can be used as an electronic component (IC chip) of electronic devices in a wide range of fields, such as digital signal processing, software-defined radio systems, avionics (electronic devices related to aviation, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), mobile phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

<Application Example to Electronic Device>

Next explained are the cases where the above-described electronic component is used for an electronic device or a housing such as a television device (TV or television receiver), a vehicle, or a structure body.

Figure 12A:
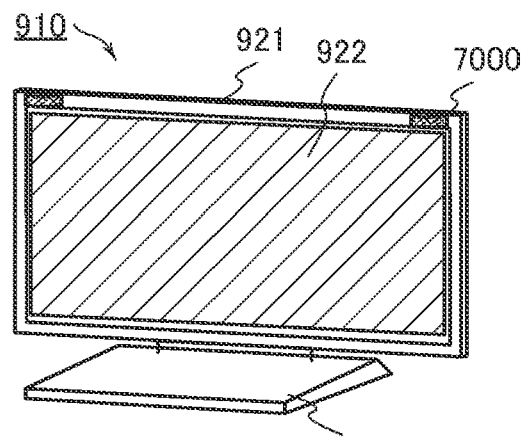
FIG. 12A to FIG. 12C are diagrams illustrating structure examples of electronic devices.

FIG. 12A shows a television device 910 including a housing 921, a display portion 922, a stand 923, and the like. The housing 921 is provided with the aforementioned electronic component 7000.

Figure 12B:
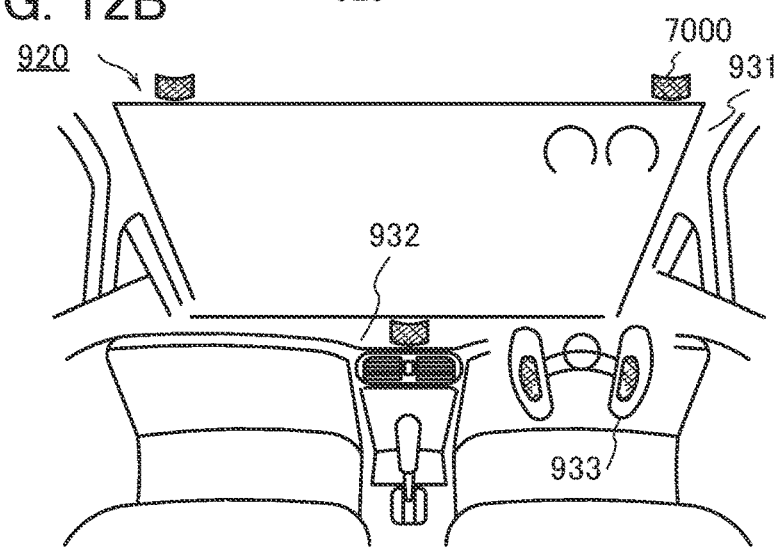

FIG. 12B shows the inner structure of an automobile 920 as an example of a vehicle; a pillar 931, a dashboard 932, a handle 933, and the like are shown as the inner structure of the automobile. The pillar 931, the dashboard 932, and the handle 933 can be provided with the aforementioned electronic component 7000.

Figure 12C:
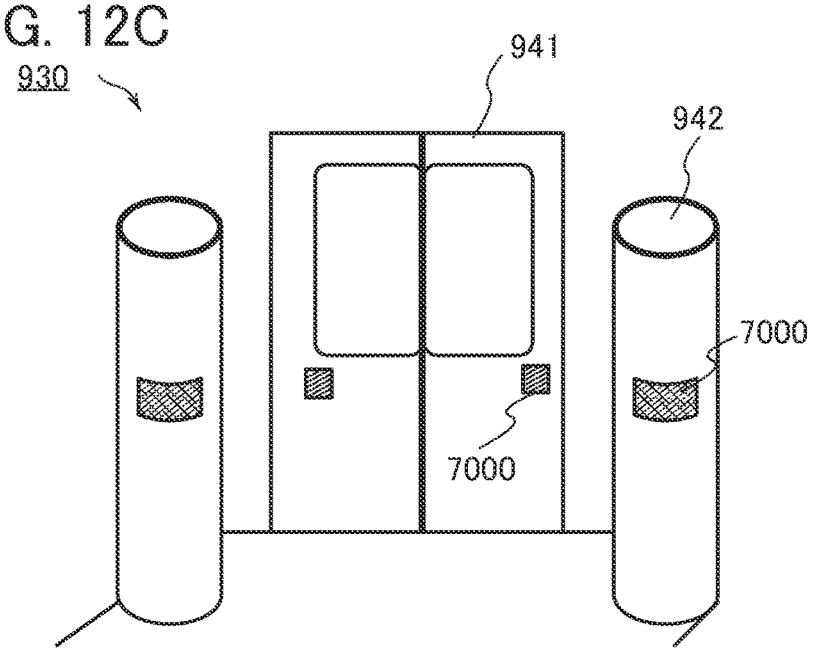

FIG. 12C shows structure bodies such as a door 941 and columns 942. The door 941 and the columns 942 are provided with the aforementioned electronic component 7000.

As described above, the electronic devices shown in this embodiment each include the aforementioned electronic component 7000. Thus, the sound from the user or the like can be identified as a sound source, and an application can be launched based on the identified sound-source location.

Example 1

Described in this example are retention characteristics of a signal in a fabricated Gilbert circuit that includes the analog potential holding circuit described above in Embodiment 1.

As transistors in the Gilbert circuit, a Si transistor was prototyped by a CMOS technology to have a channel length of 0.11 μm and an OS transistor was prototyped by a CAAC-IGZO technology to have a channel length of 60 nm. This chip was subjected to wire bonding to fabricate a semiconductor device. Input signals Vinp and Vinn and signals Vwp and Vwn determining a gain are supplied from the outside. A signal Iout is converted into a voltage via a resistor and a signal Vout amplified by an amplifier is output to the outside. The power source voltage of the semiconductor device was set to 3.3 V. The peak-to-peak values of the signals Vinp, Vinn, Vwp, and Vwn were each set to 0.4 V in order that the linearity of the output from the Gilbert circuit could be maintained.

Figure 13:
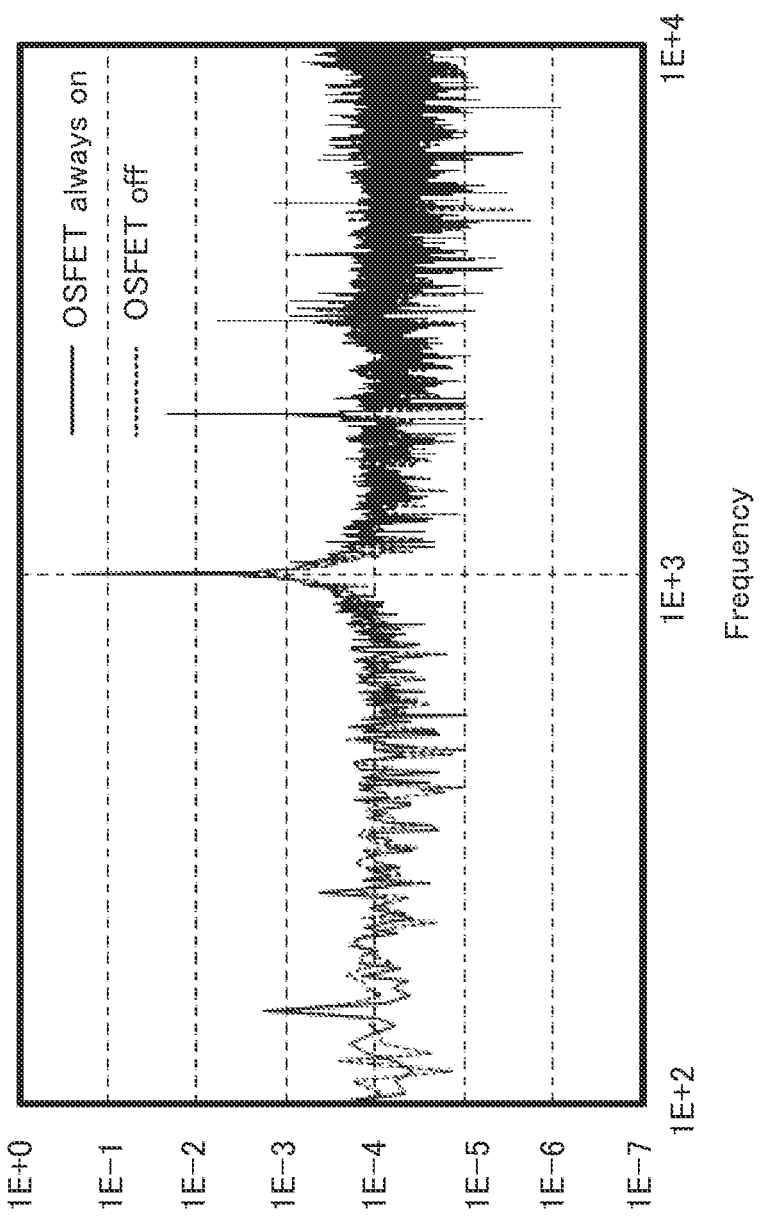
FIG. 13 is a graph showing THD+N characteristics.

In the case where an analog potential is held by turning off the OS transistor, the signals Vwp and Vwn are held in a floating node. The operation of the Gilbert circuit in that state might cause a variation in the signals Vwp and Vwn. In order to verify this variation, the THD+N (Total Harmonic Distortion+Noise) characteristics of the Gilbert circuit were examined. In this measurement, a sine wave of 1 kHz was input to the signals Vinp and Vinn and a fixed voltage was input to the signals Vwp and Vwn; then, the waveform of the signal Vout was measured when the OS transistor was kept on and when the OS transistor was turned off to hold the signal Vwn in a capacitor of the analog potential holding circuit. FIG. 13 is a waveform chart of the signal Vout. The THD+N characteristics were 12% when the OS transistor (OSFET) was in on state and 14% when the OS transistor was turned off to hold the signal Vwn, that is, the THD+N characteristics were approximately the same in either case. Thus, the signal Vwn was kept constant even when the voltage was retained in the analog potential holding circuit.

Figure 14:
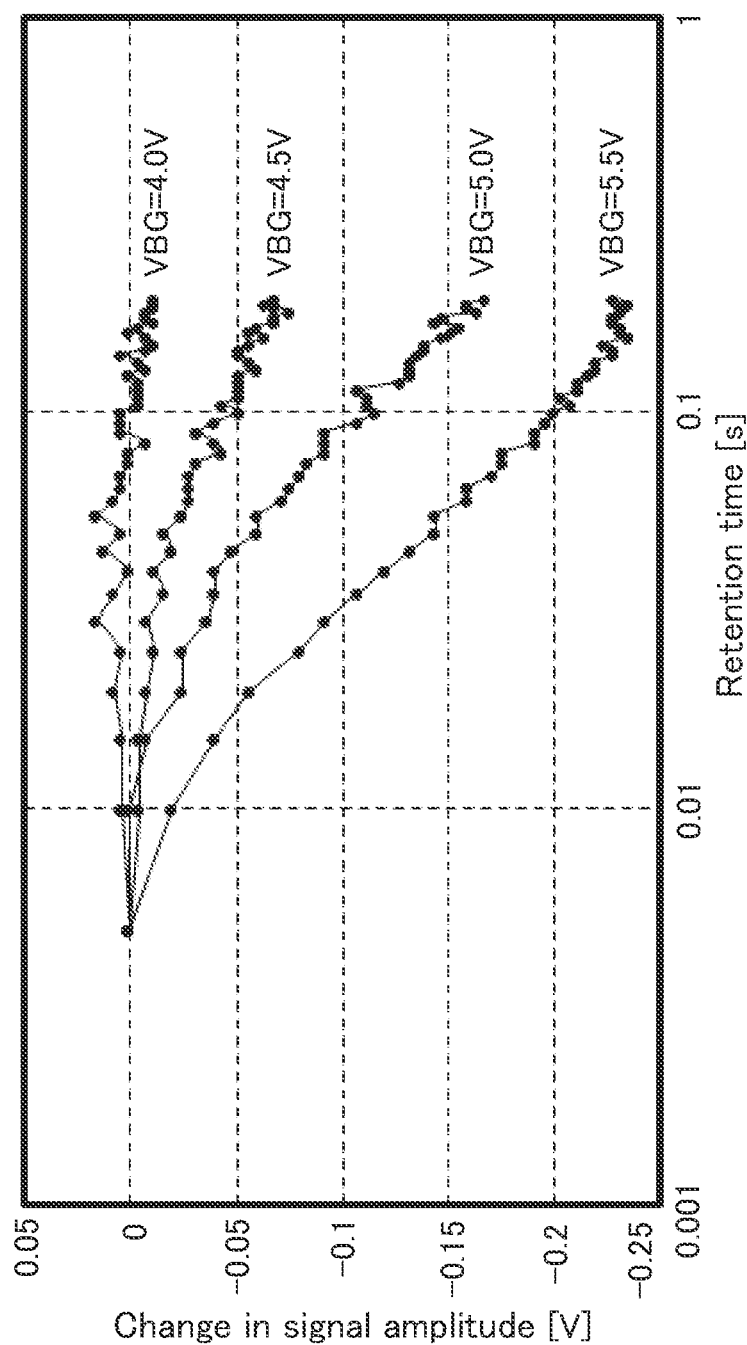
FIG. 14 is a graph illustrating the retention characteristics of signals in a semiconductor device.

The retention time of the signals Vwp and Vwn in the analog potential holding circuit using the OS transistor was measured. A sine wave of 1 kHz was input to the signals Vinp and Vinn and a fixed voltage was input to the signals Vwp and Vwn; then, a CAAC-IGZO FET, which is the OS transistor, was turned off to hold the signal Vwn in the capacitor of the analog potential holding circuit. The peak-to-peak value of the signal Vout at this time was assumed to be an initial value and a change overtime was measured. A back gate voltage VBG of the OS transistor was set to 4, 4.5, 5, and 5.5 V in the measurement. FIG. 14 shows the relation between time (retention time) and the amount of attenuation ΔVpp (a change in signal amplitude) from the initial peak-to-peak value of the signal Vout. The amount of attenuation ΔVpp was less likely to change when the back gate voltage VBG was lower, and the amount of attenuation ΔVpp after 0.2 seconds was 0.012 V when the voltage VBG was 4 V. A further decrease in the voltage VBG was found to promise longer retention time.

(Supplementary Notes on the Description in this Specification and the Like)

The following are notes on the description of the above embodiments and structures in the embodiments.

One embodiment of the present invention can be constituted by combining, as appropriate, the structure described in each embodiment with the structures described in the other embodiments or Example. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

In the drawings, the size, the layer thickness, or the region is shown with given magnitude for description convenience. Therefore, the size, the layer thickness, or the region is not limited to the shown scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

The positional relation between components shown in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, the expressions "one of a source and a drain" (or a first electrode or a first terminal) and "the other of the source and the drain" (or a second electrode or a second terminal) are used in the description of the connection relation of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential supplied to a wiring or the like is sometimes changed depending on the reference potential.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be rephrased as a node.

In this specification and the like, the expression "A and B are connected" includes the case where A and B are electrically connected. Here, the expression "A and B are electrically connected" includes the case where electric signals can be transmitted and received between A and B when an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. For another example, the term "insulating film" can be changed into the term "insulating layer" in some cases.

REFERENCE NUMERALS t0: time, t1: time, 10: audio codec, 11_1: microphone, 11_2: microphone, 12_1: amplifier circuit, 12_2: amplifier circuit, 13: mixer circuit, 14: analog-digital converter circuit, 15: digital effector, 16: digital interface, 17: external control circuit, 18: digital-analog converter circuit, 19: mixer circuit, 20_1: amplifier circuit, 20_2: amplifier circuit, 21_1: speaker, 21_2: speaker, 30: multiplier circuit, 30_0: multiplier circuit, 30_0 to 30_7: multiplier circuit, 307: multiplier circuit, 31: adder circuit, 31_1: adder circuit, 31_2: adder circuit, 32: signal generation unit, 33: power source control switch, 34: interface, 35: control circuit, 36: digital-analog converter circuit, 41: transistor, 41_1: transistor, 41_2: transistor, 41_3: transistor, 414: transistor, 41_5: transistor, 41_6: transistor, 41_7: transistor, 41_8: transistor, 42_1: transistor, 42_2: transistor, 43_1: resistor, 44: transistor, 44_1: transistor, 44_2: transistor, 45: analog potential holding circuit, 45_0: analog potential holding circuit, 45_0 to 45_15: analog potential holding circuit, 45_1: analog potential holding circuit, 45N: analog potential holding circuit, 45P: analog potential holding circuit, 46: Gilbert circuit, 47: capacitor, 51_1: comparison circuit, 51_2: comparison circuit, 52_1: speaker driver circuit, 52_2: speaker driver circuit, 53: triangle wave generation circuit, 61: operational amplifier, 62: resistor, 71_1: switch, 71_2: switch, 72_1 to 72_10: capacitor, 73_1 to 73_8: selector switch, 74: operational amplifier, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 510: insulator, 512: insulator, 514: insulator, 516: insulator, 518: conductor, 520: insulator, 522: insulator, 524: insulator, 526: insulator, 530: oxide, 530a: oxide, 530b: oxide, 530c: oxide, 540a: conductor, 540b: conductor, 542a: conductor, 542b: conductor, 543a: region, 543b: region, 544: insulator, 546: conductor, 548: conductor, 550: insulator, 560: conductor, 560a: conductor, 560b: conductor, 574: insulator, 580: insulator, 581:

insulator, 582: insulator, 586: insulator, 600: capacitor, 610: conductor, 612: conductor, 620: conductor, 630: insulator, 640: insulator, 910: television device, 920: automobile, 921: housing, 922: display portion, 923: stand, 931: pillar, 932: dashboard, 933: handle, 941: door, 942: column, 7000: electronic component, 7001: lead, 7002: printed circuit board, 7004: circuit board, 7100: semiconductor wafer, 7102: circuit region, 7104: separation region, 7106: separation line, 7110: chip

The invention claimed is:

1. A semiconductor device comprising:
   a digital-analog converter circuit;
   a control circuit;
   a power source control switch;
   an analog potential holding circuit including a first transistor; and
   a plurality of Gilbert circuits,
   wherein the analog potential holding circuit is configured to hold an analog potential output from the digital-analog converter circuit,
   wherein the control circuit is configured to control the analog potential holding circuit and the digital-analog converter circuit,
   wherein the power source control switch is configured to stop supply of a power source voltage to the control circuit in a period during which the analog potential held in the analog potential holding circuit is not updated, and
   wherein the first transistor includes a semiconductor layer including an oxide semiconductor in a channel formation region.

2. The semiconductor device according to claim 1,
   wherein the plurality of Gilbert circuits each include a second transistor, and
   wherein the second transistor includes a semiconductor layer including silicon in a channel formation region.

3. The semiconductor device according to claim 2,
   wherein the first transistor is stacked over a layer including the second transistor.

4. The semiconductor device according to claim 1, further comprising an adder circuit and an amplifier circuit,
   wherein the adder circuit is configured to add signals output from the plurality of Gilbert circuits, and
   wherein the amplifier circuit is configured to amplify signals output from the adder circuit.

5. The semiconductor device according to claim 1,
   wherein the digital-analog converter circuit, the control circuit, the power source control switch, the analog potential holding circuit, and the plurality of Gilbert circuits are included in a mixer circuit.

6. A semiconductor device comprising:
   a digital-analog converter circuit;
   an analog potential holding circuit including a first transistor; and
   a Gilbert circuit including a second transistor,
   wherein the analog potential holding circuit is configured to hold an analog potential output from the digital-analog converter circuit,
   wherein the first transistor includes a semiconductor layer including an oxide semiconductor in a channel formation region, and
   wherein one of a source and a drain of the first transistor is electrically connected to a gate of the second transistor.

7. The semiconductor device according to claim 6,
   wherein the second transistor includes a semiconductor layer including silicon in a channel formation region.

8. The semiconductor device according to claim 6,
   wherein the first transistor is stacked over a layer including the second transistor.

9. The semiconductor device according to claim 6,
   wherein the digital-analog converter circuit, the analog potential holding circuit, and the Gilbert circuit are included in a mixer circuit.

\* \* \* \* \*